United States Patent
Fukao et al.

(10) Patent No.: US 12,384,862 B2
(45) Date of Patent: Aug. 12, 2025

(54) RESIN COMPOSITION, RESIN FILM USING SAME, METAL FOIL WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Kyosuke Michigami, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 354 days.

(21) Appl. No.: 18/100,960

(22) Filed: Jan. 24, 2023

(65) Prior Publication Data

US 2023/0167215 A1    Jun. 1, 2023

Related U.S. Application Data

(63) Continuation of application No. PCT/JP2021/028472, filed on Jul. 30, 2021.

(30) Foreign Application Priority Data

Aug. 5, 2020  (JP) ................. 2020-133343

(51) Int. Cl.
*C08F 220/32* (2006.01)
*B32B 15/082* (2006.01)
(Continued)

(52) U.S. Cl.
CPC ........ *C08F 220/325* (2020.02); *B32B 15/082* (2013.01); *B32B 15/20* (2013.01);
(Continued)

(58) Field of Classification Search
CPC .......... C08F 20/32; C08F 20/42; C08F 20/44; C08F 220/325; C08F 220/1811; C08F 220/44

See application file for complete search history.

(56) References Cited

U.S. PATENT DOCUMENTS

| | | |
|---|---|---|
| 2020/0087442 A1 | 3/2020 | Tobe et al. |
| 2020/0154563 A1 | 5/2020 | Sim et al. |
| 2021/0027909 A1 | 1/2021 | Fukao et al. |

FOREIGN PATENT DOCUMENTS

| | | |
|---|---|---|
| WO | 2018/123818 A1 | 7/2018 |
| WO | 2018/216752 A1 | 11/2018 |
| WO | 2019/189750 A1 | 10/2019 |

OTHER PUBLICATIONS

Oxford Chemical Dictionary, vol. 6, (2008), p. 351, retrieved from Knovel. (Year: 2008).*

(Continued)

*Primary Examiner* — Arrie L Reuther
*Assistant Examiner* — David R. Foss
(74) *Attorney, Agent, or Firm* — GREENBLUM & BERNSTEIN, P.L.C.

(57) ABSTRACT

An aspect of the present invention relates to a resin composition containing an acrylic resin and a curing agent, in which the acrylic resin contains a polymerization unit (A) of a (meth)acrylate having an epoxy group, a polymerization unit (B) of a (meth)acrylate having a cyano group, and a polymerization unit (C) of a (meth)acrylate having an isobornyl group, a weight average molecular weight of the acrylic resin is 50,000 or more and 3,000,000 or less, and a storage modulus of a cured product of the resin composition at 200° C. is 0.1 MPa or more and 3.5 MPa or less.

15 Claims, 1 Drawing Sheet

(51) Int. Cl.
*B32B 15/20* (2006.01)
*C08F 20/32* (2006.01)
*C08F 20/42* (2006.01)
*C08F 20/44* (2006.01)
*C08F 220/18* (2006.01)
*C08F 220/44* (2006.01)
*C08J 5/18* (2006.01)
*C08K 5/09* (2006.01)

(52) U.S. Cl.
CPC ...... *C08F 220/1811* (2020.02); *C08F 220/44* (2013.01); *C08J 5/18* (2013.01); *C08K 5/09* (2013.01); *B32B 2307/304* (2013.01); *B32B 2311/12* (2013.01); *B32B 2457/08* (2013.01); *C08F 20/32* (2013.01); *C08F 20/42* (2013.01); *C08F 20/44* (2013.01); *C08J 2333/08* (2013.01); *C08J 2333/20* (2013.01)

(56) References Cited

OTHER PUBLICATIONS

ISR issued in WIPO Patent Application No. PCT/JP2021/028472, Sep. 28, 2021, translation.

\* cited by examiner

EMBEDABILITY : GOOD
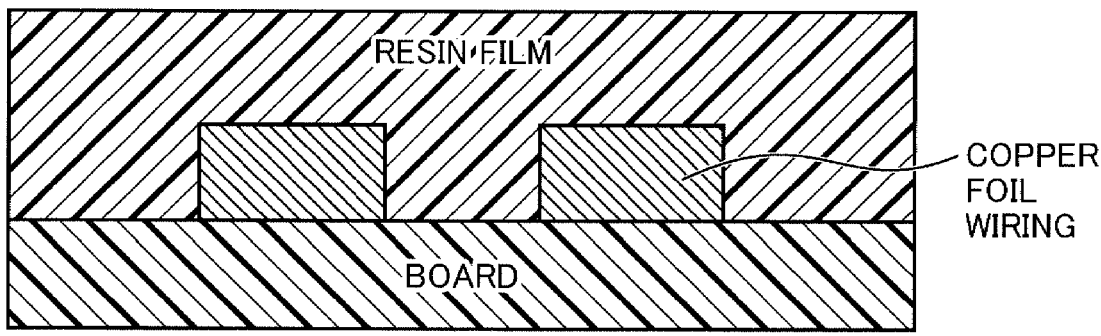
EMBEDABILITY : POOR
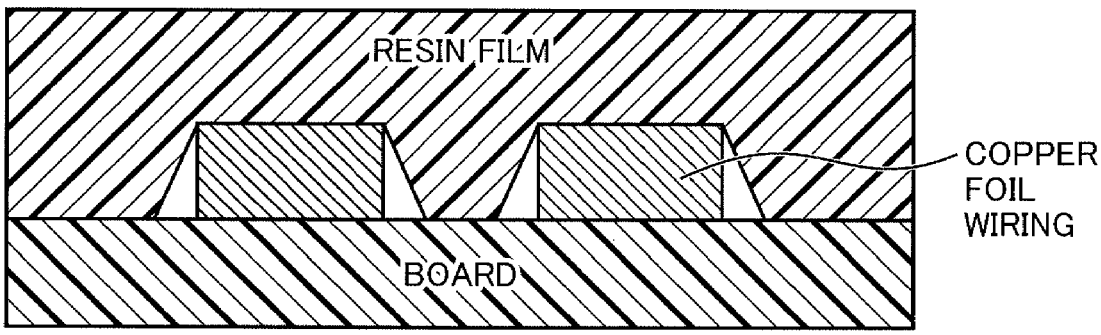

RESIN COMPOSITION, RESIN FILM USING SAME, METAL FOIL WITH RESIN, METAL-CLAD LAMINATE, AND WIRING BOARD

TECHNICAL FIELD

The present invention relates to a resin composition, particularly to a resin composition having stretchability in a cured product of the resin composition, and a resin film using the same, a metal foil with resin, a metal-clad laminate, and a wiring board.

BACKGROUND ART

Devices and board materials used in the electronics field, particularly in various interfaces such as sensors, displays, and artificial skin for robots are increasingly demanded to exhibit mountability and shape followability. There is a growing demand for flexible devices and materials that can be disposed on curved or uneven surfaces or can be freely deformed depending on the application.

In response to such demands, diverse resin substrates exhibiting flexibility (extensibility) have been studied.

For example, Patent Literature 1 discloses a stretchable resin substrate containing a rubber component and a cross-linking component. Patent Literature 2 also reports that an epoxy resin, which is a reaction product of an epoxy compound and an acid terminated polyester, exhibits excellent flexibility.

However, the stretchable resin substrate described in Patent Literature 1 contains a unreactive rubber component and is thus considered to have a problem of poor heat resistance and solvent resistance although the stretchable resin substrate is considered to exhibit stretchability.

The epoxy resin described in Literature 2 exhibits excellent flexibility, but largely shrinks during curing since the epoxy equivalent weight of the epoxy resin used is small, and a board obtained using this resin may undergo warping and deformation. Furthermore, it is considered that the weather resistance is also not sufficient.

Furthermore, resin materials used in board materials are required to exhibit excellent adhesiveness to metal layers and metal foils when used for metal-clad laminates, wiring boards and the like.

CITATION LIST

Patent Literatures

Patent Literature 1: WO 2018/123818 A
Patent Literature 2: WO 2018/216752 A

SUMMARY OF INVENTION

The present invention has been made in view of such circumstances, and an object thereof is to provide a resin composition, which exhibits excellent resin flowability, affords a cured product exhibiting excellent flexibility, heat resistance, tear strength and adhesiveness, and also exhibits excellent dimensional stability since the curing shrinkage can be suppressed, and a resin film using the same, a laminate, a wiring board and the like.

As a result of intensive studies, the present inventors have found out that the problems can be solved by a resin composition and/or a resin film having the following configuration, and completed the present invention by conducting further studies based on this finding.

In other words, the resin composition related to an aspect of the present invention contains an acrylic resin and a curing agent, in which the acrylic resin contains a polymerization unit (A) of a (meth)acrylate having an epoxy group, a polymerization unit (B) of a (meth)acrylate having a cyano group, and a polymerization unit (C) of a (meth)acrylate having an isobornyl group, a weight average molecular weight of the acrylic resin is 50,000 or more and 3,000,000 or less, and a storage modulus of a cured product of the resin composition at 200° C. is 0.1 MPa or more and 3.5 MPa or less.

BRIEF DESCRIPTION OF DRAWINGS

FIG. 1 is a schematic diagram illustrating evaluation criteria for embeddability in Examples.

DESCRIPTION OF EMBODIMENTS

Hereinafter, embodiments according to the present invention will be specifically described, but the present invention is not limited thereto.

As described above, the resin composition of the present embodiment contains at least an acrylic resin and a curing agent. The acrylic resin contains a polymerization unit (A) of a (meth)acrylate having an epoxy group, a polymerization unit (B) of a (meth)acrylate having a cyano group, and a polymerization unit (C) of a (meth)acrylate having an isobornyl group. Furthermore, the weight average molecular weight of the acrylic resin contained in the resin composition is 50,000 or more and 3,000,000 or less. The storage modulus of a cured product of the resin composition according to the present embodiment at 200° C. is 0.1 MPa or more and 3.5 MPa or less.

By such a configuration, the resin composition of the present embodiment affords a cured product exhibiting excellent flexibility, heat resistance, tear strength, and adhesiveness. Furthermore, the resin composition of the present embodiment exhibits excellent dimensional stability since the curing shrinkage can be suppressed, and has an advantage of being less likely to undergo deformation (warping) even when cured. The resin composition of the present embodiment also exhibits excellent resin flowability, and exerts excellent advantages when also used as a resin film for metal-clad laminates and wiring boards.

The storage modulus of the cured product of the resin composition according to the present embodiment is 0.1 MPa or more and 3.5 MPa or less. As the storage modulus is within the above range, the cured product of the resin composition can be equipped with heat resistance. In the present embodiment, the "storage modulus" means a storage modulus at 200° C., and is a value measured by the method described in Examples later. From the viewpoint of exerting superior heat resistance, the storage modulus is preferably 0.1 MPa or more and 2.5 MPa or less, more preferably 0.3 MPa or more and 2.0 MPa or less.

As described above, the resin composition of the present embodiment also has an advantage that a reflow process can be used in the process of mounting electronic parts since the cured product of the resin composition exhibits excellent heat resistance.

In a preferred form, the glass transition temperature (Tg) of the cured product of the resin composition according to the present embodiment is 60° or less. It is considered that this makes it possible to obtain a cured product equipped with flexibility more reliably. The glass transition temperature is more preferably 40° C. or less. Although it is not particularly required to set the lower limit, the glass transition temperature is preferably 20° C. or more from the viewpoint of the stickiness of the film surface at normal temperature when the resin composition is formed into a resin film.

In the present embodiment, the term "flexible" means that the elongation rate of the cured product of the resin composition until breakage is 5.0% or more, preferably 10% or more, more preferably 25% or more, still more preferably 50% or more, most preferably 100% or more. The term "flexible" means that the tensile modulus of the cured product of the resin composition according to the present embodiment at room temperature of 25° C. is 0.1 MPa or more and 0.5 GPa or less, preferably 1 MPa or more and 300 MPa or less, more preferably 5 MPa or more and 100 MPa or less. The values of "elongation rate until breakage" and "tensile modulus at room temperature of 25° C." in the present embodiment are values measured by the methods described in Examples later.

Meanwhile, it is not particularly required to set the upper limit for the flexibility, but it is preferable that the elongation rate does not exceed 500% from the viewpoint that the original shape is impaired when the cured product is elongated more than necessary. The index (elongation rate) indicating flexibility in the present embodiment is denoted by the elongation at break [%] in Examples.

The resin composition of the present embodiment has an advantage that the cured product thereof also has excellent tear strength and is less likely to break even when elongated.

The resin composition of the present embodiment also has an advantage that the adhesiveness between the metal foil and the board is high when used for a metal laminate since the cured product thereof also exhibits excellent adhesiveness. The resin composition of the present embodiment also exhibits excellent resin flowability, and thus exerts excellent advantages when also used for a wiring board on which a narrow wiring is formed.

First, each component contained in the resin composition of the present embodiment will be described. In the present embodiment, the resin composition is a composition before curing (uncured or semi-cured). In other words, the epoxy groups in the polymerization unit (A) described later are in an uncrosslinked state.

(Acrylic Resin)

The resin composition of the present embodiment contains an acrylic resin as a main component. The acrylic resin as used herein refers to a polymer compound obtained by subjecting a compound having one or more acryloyl groups or methacryloyl groups to a polymerization reaction. In the present embodiment, the acrylic resin serves as a binder and imparts flexibility to the cured product of the composition.

The acrylic resin has a weight average molecular weight of 50,000 or more and 3,000,000 or less, and contains a polymerization unit (A) of a (meth)acrylate having an epoxy group, a polymerization unit (B) of a (meth)acrylate having a cyano group, and a polymerization unit (C) of a (meth)acrylate having an isobornyl group.

As the weight average molecular weight of the acrylic resin used in the present embodiment is within the above range, it is possible to obtain a resin cured product and a resin film, which exhibit excellent flexibility (stretchability), tensile strength (breaking resistance) and resin flowability. The lower limit of the weight average molecular weight is more preferably 100,000 or more, still more preferably 200,000 or more. Meanwhile, the upper limit is more preferably 2,000,000 or less, still more preferably 1,000,000 or less.

The acrylic resin of the present embodiment preferably does not have unsaturated bonds such as double bonds and triple bonds between carbon atoms. In other words, it is preferable that the carbon atoms of the acrylic resin are bonded to each other by a saturated bond (single bond). By not having unsaturated bonds between carbon atoms, it is considered that the acrylic resin is not oxidized over time and can further maintain the elasticity.

The acrylic resin of the present embodiment is not an acrylic resin obtained by polymerizing only the polymerization unit (A), only the polymerization unit (B), or only the polymerization unit (C), but is a resin obtained by randomly polymerizing the polymerization unit (A), the polymerization unit (B) and the polymerization unit (C). The form of polymerization is not particularly limited, and the acrylic resin may be a block copolymer, an alternating copolymer, a random copolymer, a graft copolymer or the like.

Polymerization Unit (A) of (Meth)Acrylate Having Epoxy Group

In the present embodiment, the acrylic resin contains a polymerization unit (A) of a (meth)acrylate having an epoxy group. The polymerization unit (A) imparts a crosslinking point to the acrylic resin of the present embodiment and enables the acrylic resin to be cured. As the acrylic resin has an epoxy group, it is considered that the heat resistance of the cured product after thermal curing is improved.

The content of the polymerization unit (A) in the acrylic resin is not particularly limited, but is preferably such that the epoxy equivalent weight of the polymerization unit (A) with respect to the total amount of the acrylic resin is about 1000 g/eq or more and 8000 g/eq or less. As the epoxy equivalent weight is in such a range, it is considered that a resin composition exhibiting heat resistance and a proper modulus is obtained more reliably. When the epoxy equivalent weight is less than 1000 g/eq, the elastic modulus after curing becomes too high and breakage may occur during elongation. When the epoxy equivalent weight exceeds 8,000 g/eq, the elastic modulus after curing at a high temperature becomes low, and for example, the film may be deformed in the reflow process, resulting in defective mounting. A more preferable range of the epoxy equivalent weight is 1500 g/eq or more and 5000 g/eq or less.

Specific examples of the (meth)acrylate monomer constituting the polymerization unit (A) having an epoxy group include glycidyl (meth)acrylate, β-methylglycidyl (meth)acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, o-isopropenylbenzyl glycidyl ether, m-isopropenylbenzyl glycidyl ether, and p-isopropenylbenzyl glycidyl ether. These may be used singly or in combination of two or more kinds thereof.

Polymerization Unit (B) of (Meth)Acrylate Having Cyano Group

In the present embodiment, the acrylic resin contains a polymerization unit (B) of a (meth)acrylate having a nitrile group. By containing a (meth)acrylate having a cyano group in this way, hydrogen bonding with the surface of the metal foil occurs, and there is an advantage that the adhesiveness is excellent when the resin composition or resin film of the present embodiment is used in a metal-clad laminate. By having the polymerization unit (B), it is considered that sufficient tear strength is obtained and heat resistance is also further improved.

Specific examples of the (meth)acrylate monomer constituting the polymerization unit (B) having a cyano group are not particularly limited, but the specific examples include acrylonitrile and methacrylonitrile.

The polydispersity (Mw/Mn) of the average molecular weight of the acrylic resin used in the resin composition of the present embodiment preferably satisfies the following Equation (1).

$$1.1 \leq Mw/Mn \leq 3.0 \quad (1)$$

In Equation (1), Mn is the number average molecular weight and Mw is the weight average molecular weight.

When the polydispersity of the average molecular weight of the acrylic resin is within the above range, it is considered that a resin composition affording a cured product having sufficient breaking strength can be obtained.

The resin composition of the present embodiment preferably contains the polymerization unit (B) component at 1 part by mass or more and 30 parts by mass or less with respect to 100 parts by mass of the acrylic resin. When the content is within this range, it is considered that the above-described effects can be obtained more reliably. When the content of the polymerization unit (B) component is less than this, the adhesiveness to copper foil may deteriorate. It is not preferable that the content exceeds the above range since the elastic modulus becomes high and the stretchability may be poor. A still more preferable content of the polymerization unit (B) component is 10 parts by mass or more and 20 parts by mass or less with respect to 100 parts by mass of the acrylic resin.

Polymerization Unit (C) of (Meth)Acrylate Having Isobornyl Group

In the present embodiment, the acrylic resin further contains a polymerization unit (C) of a (meth)acrylate having an isobornyl group. By containing the polymerization unit (C) component having an isobornyl group, it is possible to suppress the increase in curing shrinkage and thus to suppress deformation such as warping when the resin composition or resin film is cured.

Specific examples of the acrylate or (meth)acrylate monomer constituting the polymerization unit (C) having an isobornyl group are not particularly limited, but include isobornyl (meth)acrylate.

The resin composition of the present embodiment preferably contains the polymerization unit (C) component at 1 part by mass or more and 50 parts by mass or less with respect to 100 parts by mass of the acrylic resin. When the content is within this range, it is considered that the above-described effects can be obtained more reliably. When the content of the polymerization unit (C) component is less than this, the dimensional stability may be poor. It is not preferable that the content exceeds the above range since the reactivity of the polymerization unit (A) of a (meth)acrylate having an epoxy group decreases and the heat resistance of the resin composition after thermal curing is poor. It is not preferable that the content exceeds the above range from the viewpoint of printability as well since the viscosity of the resin composition increases. A still more preferable content of the polymerization unit (C) component is 10 parts by mass or more and 30 parts by mass or less with respect to 100 parts by mass of the acrylic resin.

Polymerization Unit Other than the Above

The acrylic resin of the present embodiment may contain other polymerization units in addition to the polymerization units (A), (B), and (C) described above.

Specifically, examples of other polymerization units include an acrylic monomer represented by the following Formula (1) (hereinafter also referred to as polymerization unit (D)).

[Chemical formula 1]

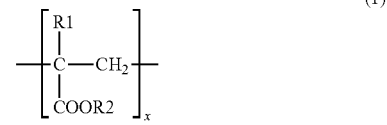

In Formula (1), R1 is hydrogen or a methyl group and R2 is hydrogen or an alkyl group. X denotes an integer.

The acrylic monomer represented by Formula (1) preferably has a low glass transition temperature (Tg) in order to impart flexibility to the resin composition of the present embodiment.

Specific examples of the acrylic monomer represented by Formula (1) include ethyl acrylate, butyl acrylate, and 2-ethylhexyl acrylate.

The proportion of the acrylic resin blended in the resin composition of the present embodiment is not particularly limited as long as the effects of the present invention such as flexibility and adhesiveness are obtained, but is, for example, preferably about 50 to 70 mass % with respect to the entire resin composition.

Furthermore, the resin composition of the present embodiment may contain a resin other than the acrylic resin, and an epoxy resin, a urethane resin, an acrylic resin, a fluororesin, a silicone resin and the like can be further added depending on the purpose.

(Curing Agent)

The resin composition of the present embodiment further contains a curing agent. The curing agent that can be used in the present embodiment is not particularly limited as long as it acts as an epoxy curing agent. Specifically, examples thereof include a phenol resin, an amine-based compound, an acid anhydride, an imidazole-based compound, a sulfide resin, a dicyandiamide, a mercapto-based compound, an onium salt, and a peroxide. A light/ultraviolet curing agent, a thermal cationic curing agent and the like can also be used. These may be used singly or in combination of two or more kinds thereof depending on the situation. Preferably, the curing agent of the present embodiment contains at least one selected from an acid anhydride, an amine-based curing agent, a phenol-based curing agent, or a carboxylic acid-based curing agent.

Among these, it is preferable to use an acid anhydride as the curing agent, and examples of the acid anhydride curing agent include maleic anhydride, succinic anhydride, itaconic anhydride, citraconic anhydride, phthalic anhydride, 1,2,3,6-tetrahydrophthalic anhydride, 3,4,5,6-tetrahydrophthalic anhydride, hexahydrophthalic anhydride, 4-methylhexahydrophthalic anhydride, 3-methyl-1,2,3,6-tetrahydrophthalic anhydride, 4-methyl-1,2,3,6-tetrahydrophthalic anhydride, and methyl-3,6-endo-methylene-1,2,3,6-tetrahydrophthalic anhydride.

Preferably, the curing agent of the present embodiment desirably contains a polyfunctional acid anhydride having a functionality of two or more. There is thus an advantage that three-dimensional crosslinking can be achieved and deformation particularly at high temperatures can be suppressed. In addition, curing shrinkage can be diminished.

As the polyfunctional acid anhydride having a functionality of two or more, a commercially available product can be used, and examples thereof include RIKACID BT-100, TDA-100, and TBN-100 (all manufactured by New Japan Chemical Co., Ltd.) and ENEHYDE CpODA (manufactured by JXTG Nippon Oil & Energy Corporation).

In a case where the curing agent contains the polyfunctional acid anhydride, the acid anhydride equivalent weight of the curing agent of the present embodiment is preferably 100 g/eq or more and 500 g/eq or less. It is considered that the above-described effects can be thus obtained more reliably. A more preferable acid anhydride equivalent weight is 300 g/eq or more and 500 g/eq or less.

In the resin composition of the present embodiment, the amount of the curing agent added can be appropriately set according to the epoxy equivalent weight.

Furthermore, the resin composition according to the present embodiment may contain other additives, for example, a curing accelerator (curing catalyst), a surfactant, a flame retardant, a flame retardant promoter, a leveling agent, a colorant, a ultraviolet absorber, an infrared absorber, an antistatic agent, a conduction auxiliary, and inorganic fine particles if necessary within a range in which the effects of the present invention is not impaired.

(Curing Accelerator)

The curing accelerator usable in the present embodiment is not particularly limited, but for example, imidazoles and derivatives thereof, organophosphorus-based compounds, metal soaps such as zinc octanoate, secondary amines, tertiary amines, and quaternary ammonium salts can be used. These may be used singly or in combination of two or more kinds thereof depending on the situation.

In the case of using a curing accelerator, it is preferable to use the curing accelerator so that the content thereof is 0.01 to 1 mass % with respect to 100 parts by mass of the resin composition.

(Surfactant)

The resin composition of the present embodiment may contain a surfactant in order to improve wettability with the substrate during film fabrication. Usable surfactants include various surfactants such as nonionic, cationic and anionic surfactants.

In the case of using a surfactant, it is preferable to use the surfactant so that the content thereof is 0.01 to 1.5 mass % with respect to 100 parts by mass of the resin composition.

(Preparation of Resin Composition and Resin Film)

The method for preparing the resin composition containing the acrylic resin of the present embodiment is not particularly limited, and for example, the acrylic resin, a curing agent and a solvent are uniformly mixed. The solvent to be used is not particularly limited, and for example, toluene, xylene, methyl ethyl ketone, and acetone can be used. These solvents may be used singly or in combination of two or more kinds thereof. Here, an organic solvent for adjusting the viscosity and various additives may be further blended if necessary.

The resin film of the present embodiment can be obtained by heating and drying the resin composition obtained as described above and evaporating the solvent. In other words, the present embodiment also includes a resin film formed using a resin composition as described above.

The method and apparatus for heating and drying the resin composition and the conditions of these may be the same various means as conventional means or improved means thereof. The specific heating temperature and time can be appropriately set depending on the curing agent, solvent and the like used, but for example, the resin composition can be formed into a resin film by being heated and dried at 130° C. to 200° C. for about 60 to 180 minutes.

The resin film of the present embodiment may be composed only of the above-described resin composition or a semi-cured product thereof, but may be in the form of a film with resin having a resin layer containing the resin composition or a semi-cured product thereof; and a support (supporting film). In other words, the present embodiment also includes a resin sheet material including the resin film and a support overlapping with this resin film. Examples of the support include electrical insulating films such as a polyimide film, a PET (polyethylene terephthalate) film, a polyester film, a poly(parabanic acid) film, a polyether ether ketone film, a polyphenylene sulfide film, an aramid film, a polycarbonate film, and a polyarylate film.

The film with resin (resin sheet material) of the present embodiment may be a film with resin including the resin composition before curing (uncured) (the resin composition in A stage) and a support, or a film with resin including a semi-cured product of the resin composition (the resin composition in B stage) and a support.

As the method for fabricating such a film with resin, for example, a resin composition in the form of a resin varnish as described above is applied to the surface of a film supporting substrate, and then the solvent is volatilized from the varnish and diminished or removed, whereby a film with resin before curing (in A stage) or in a semi-cured state (B stage) can be obtained.

In the film with resin of the present embodiment as well, a resin composition as described above or a semi-cured product thereof may be one obtained by drying or heating and drying the resin composition.

In the present embodiment, the "semi-cured product" is one in a state in which the resin composition is partly cured so as to be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, semi-curing includes the state between after the viscosity starts to increase and before the resin composition is completely cured.

Furthermore, the resin film of the present embodiment also includes a cured resin film obtained by curing a film with resin before curing (in A stage) or in a semi-cured state (B stage) as described above.

(Application of Resin Film)

The resin film of the present embodiment can be used as a material or board for all kinds of electronic parts in a variety of applications. In particular, the resin film exhibits excellent flexibility and strength, is equipped with all of adhesiveness, resin flowability, and dimensional stability, and is thus greatly suitable as a material used in, for example, bendable electronic paper, organic EL displays, solar cells, RFID, pressure sensors, wearable devices, and skin patch devices.

(Resin-Coated Metal Foil, Metal-Clad Laminate, and Wiring Board)

Next, a metal foil with resin, a metal-clad laminate, a wiring board, and the like obtained using the resin composition and/or resin film of the present embodiment will be described.

The metal foil with resin of the present embodiment includes a resin layer containing the resin film described above and a metal foil overlapping with the resin layer. In other words, the metal foil with resin has a configuration in which the metal foil is laminated on at least one side of the resin layer. The metal foil may be present on both sides of the resin layer. The metal foil with resin of the present embodiment may be a metal foil with resin including a resin layer containing the resin composition before curing (the resin composition in A stage) and a metal foil, or a metal foil with resin including a resin layer containing a semi-cured product of the resin composition (the resin composition in B stage) and a metal foil.

Examples of the method for fabricating such a metal foil with resin include a method in which a resin composition in the form of a resin varnish as described above is applied to the surface of a metal foil such as copper foil and then dried. Examples of the coating method include a bar coater, a comma coater, a die coater, a roll coater, and a gravure coater.

As the metal foil, metal foils used in metal-clad laminates, wiring boards and the like can be used without limitation, and examples thereof include copper foil and aluminum foil.

The thickness and the like of the metal foil and film supporting substrate can be appropriately set depending on the desired purpose.

Drying or heating and drying conditions in the fabrication method of the metal foil with resin and film with resin are not particularly limited, but a resin composition in the form of a resin varnish is applied to the metal foil and film supporting substrate, and then heating and drying is performed under the same conditions as those for the resin film to volatilize the solvent from the varnish and diminish or remove the solvent, whereby the metal foil with resin and film with resin before curing (in A stage) or in a semi-cured state (B stage) are obtained.

The metal foil with resin and film with resin may include a cover film and the like if necessary. By including a cover film, it is possible to prevent foreign matter from entering. The cover film is not particularly limited as long as it can be peeled off without damaging the form of the resin composition, and for example, a polyolefin film, a polyester film, a TPX film, films formed by providing a mold releasing agent layer on these films, and paper obtained by laminating these films on a paper substrate can be used.

The metal-clad laminate of the present embodiment includes an insulating layer containing a cured product of the resin composition described above, and a metal foil overlapping with the insulating layer. As the metal foil used in the metal-clad laminate, those the same as the metal foils described above can be used.

As the metal-clad laminate of the present embodiment, one or a plurality of the resin films are laminated one on another, and a metal foil such as copper foil is further laminated on both upper and lower sides or on one side, and this is laminated and integrated by heat and press molding, whereby a double-sided metal foil clad or single-sided metal foil clad laminated body can be fabricated. The heating and pressing conditions can be appropriately set depending on the thickness of the laminate to be fabricated, the kind of the resin composition, and the like, but for example, the temperature may be set to 150° C. to 220° C., the pressure may be set to 1.5 to 5.0 MPa, and the time may be set to 60 to 180 minutes.

The wiring board of the present embodiment includes an insulating layer containing the above-described resin film or a cured product of the above-described resin composition, and a wiring. The wiring is provided on at least one selected from the surface or inside of the insulating layer.

The resin composition and resin film of the present embodiment are suitably used as materials for insulating layers of wiring boards. As the method for fabricating the wiring board, for example, the metal foil on the surface of the metal-clad laminated body obtained above is etched to form a circuit (wiring), whereby a wiring board having a conductor pattern (wiring) provided as a circuit on the surface of the laminated body can be obtained. Examples of the circuit forming method include circuit formation by a semi additive process (SAP) or a modified semi additive process (MSAP) in addition to the method described above.

A metal foil with resin, a metal-clad laminate, and a wiring board obtained by using the resin composition and resin film of the present embodiment exhibit excellent flexibility, heat resistance and strength (tensile strength), are equipped with all of adhesiveness, resin flowability and dimensional stability, and are thus extremely useful in industrial applications.

Hereinafter, the present invention will be described further specifically with reference to Examples, but the scope of the present invention is not limited to these.

EXAMPLES

First, all kinds of materials used in the present Examples are as follows.
(Acrylic Resin 1)

Blended were acrylonitrile as a polymerization unit (B), isobornyl acrylate as a polymerization unit (C), and a polymerization unit (D) represented by the following Formula (1) at the proportions (% by weight) presented in Table 1, and glycidyl methacrylate as a polymerization unit (A) was further added so that the epoxy equivalent weight thereof with respect to the total amount of the acrylic resin was the numerical value presented in Table 1. After that, the mixture was subjected to the polymerization reaction to obtain acrylic resin 1 containing methyl ethyl ketone as a solvent ("PMS-14-67" manufactured by Nagase ChemteX Corporation). The solid ratio was 40 weight %.

[Chemical formula 2]

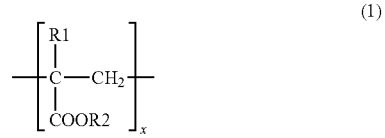

(1)

(Where, R1 is hydrogen or a methyl group and R2 is hydrogen or an alkyl group. X denotes an integer.)
(Acrylic Resins 2 to 15)

Acrylic resins 2 to 15 were prepared in the same manner as acrylic resin 1 except that the proportions of the polymerization units (B) to (D) blended were changed to numerical values presented in Table 1 and the amount of the polymerization unit (A) added was changed so that the epoxy equivalent weight thereof in each acrylic resin was the numerical value presented in Table 1. In acrylic resins 2 to 15, the solid ratio was 40 weight %.

The number average molecular weight (Mn), weight average molecular weight (Mw), and polydispersity (Mw/Mn) of acrylic resins 1 to 15 are further presented in Table 1 below.

Each molecular weight and polydispersity were determined as follows. The dried product of the resin composition obtained above was immersed in THF, sufficiently stirred, and subjected to suction filtration through a PTFE membrane filter to remove insoluble matter, whereby a dissolved product of the resin composition was obtained. The molecular weight calibration curve created using a monodisperse polystyrene standard sample was used to calculate the number average molecular weight Mn and weight average molecular weight Mw of the dissolved product thus obtained. The polydispersity Mw/Mn was calculated from these. A gel permeation chromatography instrument (Nexera GPC system manufactured by Shimadzu Corporation) was used to measure the molecular weights of each acrylic resin.

TABLE 1

|  | Acrylic resin 1 | Acrylic resin 2 | Acrylic resin 3 | Acrylic resin 4 | Acrylic resin 5 | Acrylic resin 6 | Acrylic resin 7 | Acrylic resin 8 |
|---|---|---|---|---|---|---|---|---|
| Polymerization unit (B) [weight %] | 10 | 10 | 10 | 10 | 10 | 1 | 30 | 10 |
| Polymerization unit (C) [weight %] | 20 | 20 | 20 | 20 | 20 | 20 | 20 | 1 |
| Polymerization unit (D) [weight %] | 70 | 70 | 70 | 70 | 70 | 79 | 50 | 89 |
| Epoxy equivalent weight [g/eq] | 1818 | 1818 | 1818 | 1020 | 7692 | 1818 | 1818 | 1818 |
| Number average molecular weight Mn [×10$^3$] | 137 | 25 | 1325 | 148 | 143 | 139 | 140 | 153 |
| Weight average molecular weight Mw [×10$^3$] | 290 | 51 | 2893 | 301 | 303 | 305 | 297 | 311 |
| Polydispersity Mw/Mn | 2.1 | 2.0 | 2.2 | 2.0 | 2.1 | 2.2 | 2.1 | 2.0 |

|  | Acrylic resin 9 | Acrylic resin 10 | Acrylic resin 11 | Acrylic resin 12 | Acrylic resin 13 | Acrylic resin 14 | Acrylic resin 15 |
|---|---|---|---|---|---|---|---|
| Polymerization unit (B) [weight %] | 10 | 10 | 10 | 10 | 0 | 30 | 10 |
| Polymerization unit (C) [weight %] | 50 | 20 | 20 | 20 | 20 | 0 | 20 |
| Polymerization unit (D) [weight %] | 40 | 70 | 70 | 70 | 80 | 70 | 70 |
| Epoxy equivalent weight [g/eq] | 1818 | 1818 | 1818 | 1818 | 1818 | 1818 | 0 |
| Number average molecular weight Mn [×10$^3$] | 138 | 17 | 21 | 1438 | 133 | 151 | 140 |
| Weight average molecular weight Mw [×10$^3$] | 295 | 53 | 43 | 3358 | 278 | 314 | 299 |
| Polydispersity Mw/Mn | 2.1 | 3.1 | 2.0 | 2.3 | 2.1 | 2.1 | 2.1 |

(Curing Agent)
  Acid anhydride ("RIKACID TBN-100" manufactured by New Japan Chemical Co., Ltd., acid anhydride equivalent weight: 464 g/eq.)
  Amine-based curing agent ("D2000" manufactured by MITSUI FINE CHEMICALS, INC., polyether amine)
  Phenol-based curing agent ("ELPC75" manufactured by Gun Ei Chemical Industry Co., Ltd., acid equivalent weight: 211 g/eq.)
  Carboxylic acid-based curing agent ("TN-1" manufactured by NOF Corporation, acid equivalent weight: 260 g/eq.)
(Curing Accelerator)
  Imidazole-based curing accelerator ("2E4MZ" manufactured by SHIKOKU CHEMICALS CORPORATION, 2-ethyl-4-methylimidazole)

(Surfactant)
  Surfactant ("BYK-3440" manufactured by BYK)

<Fabrication of Resin Films 1 to 18>

Resin varnishes 1 to 18 were prepared by adding the blended composition (parts by mass) presented in Table 2 to a solvent (methyl ethyl ketone) so that the solid content in the composition was about 43 mass %. After being subjected to standing and defoaming, each of the resin varnishes 1 to 18 was applied to a PET film (SP-PET 01 manufactured by Mitsui Chemicals Tohcello, Inc.) using a bar coater. Subsequently, heating was performed in an oven at 80° C. for 60 minutes and further at 160° C. for 5 minutes to obtain semi-cured resin films 1 to 18. Resin films 1 to 12 correspond to resin films (Examples) of the present invention, and resin films 13 to 18 correspond to examples for comparison.

TABLE 2

|  |  | Resin varnish 1 | Resin varnish 2 | Resin varnish 3 | Resin varnish 4 | Resin varnish 5 | Resin varnish 6 | Resin varnish 7 | Resin varnish 8 | Resin varnish 9 |
|---|---|---|---|---|---|---|---|---|---|---|
| Acrylic resin | Acrylic resin 1 | 95.18 | | | | | | | | |
|  | Acrylic resin 2 | | 95.18 | | | | | | | |
|  | Acrylic resin 3 | | | 95.18 | | | | | | |
|  | Acrylic resin 4 | | | | 92.61 | | | | | |

TABLE 2-continued

| | | | | | | | | | | |
|---|---|---|---|---|---|---|---|---|---|---|
| | Acrylic resin 5 | | | | 97.83 | | | | | |
| | Acrylic resin 6 | | | | | 95.18 | | | | |
| | Acrylic resin 7 | | | | | | 95.18 | | | |
| | Acrylic resin 8 | | | | | | | 95.18 | | |
| | Acrylic resin 9 | | | | | | | | 95.18 | |
| | Acrylic resin 10 | | | | | | | | | |
| | Acrylic resin 11 | | | | | | | | | |
| | Acrylic resin 12 | | | | | | | | | |
| | Acrylic resin 13 | | | | | | | | | |
| | Acrylic resin 14 | | | | | | | | | |
| | Acrylic resin 15 | | | | | | | | | |
| Curing agent | TBN-100 | 3.43 | 3.43 | 3.43 | 5.96 | 0.83 | 3.43 | 3.43 | 3.43 | 3.43 |
| | D2000 | | | | | | | | | |
| | ELPC75 | | | | | | | | | |
| | TN-1 | | | | | | | | | |
| Curing accelerator | 2E4MZ | 0.42 | 0.42 | 0.42 | 0.42 | 0.42 | 0.42 | 0.42 | 0.42 | 0.42 |
| Surfactant | BYK-3440 | 0.97 | 0.97 | 0.97 | 0.97 | 0.97 | 0.97 | 0.97 | 0.97 | 0.97 |

| | | Resin varnish 10 | Resin varnish 11 | Resin varnish 12 | Resin varnish 13 | Resin varnish 14 | Resin varnish 15 | Resin varnish 16 | Resin varnish 17 | Resin varnish 18 |
|---|---|---|---|---|---|---|---|---|---|---|
| Acrylic resin | Acrylic resin 1 | 88.73 | 94.22 | 90.04 | | | | | | |
| | Acrylic resin 2 | | | | | | | | | |
| | Acrylic resin 3 | | | | | | | | | |
| | Acrylic resin 4 | | | | | | | | | |
| | Acrylic resin 5 | | | | | | | | | |
| | Acrylic resin 6 | | | | | | | | | |
| | Acrylic resin 7 | | | | | | | | | |
| | Acrylic resin 8 | | | | | | | | | |
| | Acrylic resin 9 | | | | | | | | | |
| | Acrylic resin 10 | | | | 95.18 | | | | | |
| | Acrylic resin 11 | | | | | 95.18 | | | | |
| | Acrylic resin 12 | | | | | | 95.18 | | | |
| | Acrylic resin 13 | | | | | | | 95.18 | | |
| | Acrylic resin 14 | | | | | | | | 95.18 | |
| | Acrylic resin 15 | | | | | | | | | 99.08 |
| Curing agent | TBN-100 | | | | 3.43 | 3.43 | 3.43 | 3.43 | 3.43 | |
| | D2000 | 9.76 | | | | | | | | |
| | ELPC75 | | 4.37 | | | | | | | |
| | TN-1 | | | 8.59 | | | | | | |
| Curing accelerator | 2E4MZ | 0.45 | 0.42 | 0.41 | 0.42 | 0.42 | 0.42 | 0.42 | 0.42 | |
| Surfactant | BYK-3440 | 1.06 | 0.98 | 0.96 | 0.97 | 0.97 | 0.97 | 0.97 | 0.97 | 0.92 |

<Method for Fabricating Cured Resin Films 1 to 18>

The semi-cured resin films 1 to 18 obtained above were each further heated at 160° C. for 1 hour to obtain cured resin films 1 to 18.

<Method for Fabricating Semi-Cured Resin-Coated Copper Foils 1 to 18>

Resin varnishes 1 to 18 obtained above were applied to copper foil (CF-T9DA-SV-18 manufactured by FUKUDA METAL FOIL & POWDER CO., LTD.) using a bar coater. Subsequently, heating was performed in an oven at 80° C. for 24 hours and further at 160° C. for 5 minutes to obtain semi-cured resin-coated copper foils 1 to 18 including resin films 1 to 18 and copper foil.

<Method for Fabricating Cured Resin-Coated Copper Foils 1 to 18>

The semi-cured resin-coated copper foils 1 to 18 obtained above were each further heated at 160° C. for 1 hour to obtain cured resin-coated copper foils 1 to 18.

[Evaluation Test]

<Method for Measuring Molecular Weight>

In a glass bottle, 1.0 g of each of acrylic resins 1 to 15 was placed and heated at 80° C. for 6 hours to volatilize the solvent. Next, tetrahydrofuran was added so that the concentration was 0.05% to 1.0 weight % and stirring was sufficiently performed to dissolve each acrylic resin. The molecular weight was then measured by GPC (gel permeation chromatography, LC-2030C 3D Plus manufactured by Shimadzu Corporation) under the following conditions: columns G1000H, G2000H, G3000H, and G4000H (manufactured by Tosoh Corporation), temperature of 40° C., flow velocity of 1.0 mL/min, and sample injection volume of 0.01 mL. An RI (refractive index) detector was used as the detector.

<Method for Measuring Glass Transition Temperature and Storage Modulus at 200° C.>

Each of the cured resin films (cured resin films 1 to 18) was cut to 10 mm×30 mm and attached to a dynamic viscoelasticity measuring instrument (DMS6100 manufactured by Seiko Instruments Inc.). The test was performed at a strain amplitude of 10 μm, a frequency of 10 Hz (sine wave), and a rate of temperature increase of 5° C./min, and the peak temperature of tan δ calculated was adopted as the glass transition temperature.

The storage modulus at 200° C. was also measured in the same manner using the measuring instrument.

<Method for Measuring Tensile Modulus, Elongation at Break, and Stress at Break>

Each of the cured resin films (cured resin films 1 to 18) was cut into dumbbell type 6 (JIS K 6251, 2017) and attached to a universal testing machine (AGS-X manufactured by Shimadzu Corporation). The test was performed at a tension speed of 25 mm/min, the slope of r-σ was determined from all stress (σ) data corresponding to strain (r) from 0 to 0.05 by the least squares method, and the initial tensile modulus was calculated.

Strain $(r)=x/x0$ ($x$ is the gripper moving distance, $x0$ is the initial distance between grippers)

Stress $(σ)=F/(d·l)$ ($F$ is the test force, $d$ is the film thickness, and $l$ is the width of test piece)

The elongation rate and stress at break when each cured resin film was broken were measured using the testing machine.

Acceptance criteria in this test were 0.1 MPa or more for the tensile modulus, 50% or more for the elongation at break, and 4 Pa or more for the stress at break, respectively.

<Method for Measuring Deformation>

After being subjected to standing and defoaming, each of the resin varnishes (resin varnishes 1 to 18) was applied to a 50 μm polyimide film subjected to mold release treatment (UPILEX S manufactured by UBE Corporation) using a bar coater. Subsequently, heating was performed in an oven at 80° C. for 60 minutes and further at 160° C. for 5 minutes to obtain a 100 μm thick semi-cured resin film (for deformation measurement) from each resin varnish. Each semi-cured resin film thus obtained was cut to 100 mm×100 mm and then heated at 160° C. for 6 hours. After cooling, the obtained cured resin film was peeled off from the polyimide film, the dimensions were measured, and the deformation was calculated. The acceptance criterion for the warping deformation in this test was set to 0.5% or less.

<Method for Measuring Copper Foil Peeling Stress>

Each of the cured resin-coated copper foils (cured resin-coated copper foils 1 to 18) was cut into 10 mm×150 mm and attached to a stainless steel plate (SUS plate) using an adhesive. After that, the portion not coated with the resin varnish was pinched with fingers and the copper foil was peeled off by 10 mm. Subsequently, the copper foil was attached to a universal testing machine (EZ Test manufactured by Shimadzu Corporation) and tested at a tension speed of 100 mm/min, and the stress thereof was measured. The average for 10 mm strokes for which the measured values were stable was adopted as the copper foil peeling stress. The acceptance criterion for the peeling stress in this test was set to 1.0 kN/m or more.

<Method for Evaluating Resin Flowability (Embeddability)>

A board was prepared by etching the copper foil in a 100 mm square copper-clad laminate constituted of a laminated body of a 400 μm thick glass epoxy board and 18 μm thick copper foil so that the wiring width was 100 μm and the distance between wirings was 100 μm. Each of the semi-cured resin films (the semi-cured resin films 1 to 18) was disposed on the surface of the board on which wiring was formed, and a polyimide film subjected to mold release coating was further disposed thereon to obtain a laminated body. This laminated body was further sandwiched between two stainless steel plates (SUS plates). This was set in a vacuum heating press (ASFV-25 manufactured by Shinto Metal Industries, Ltd.) and heated at 160° C. for 1 hour under pressure of 1 MPa. The cross section of the obtained laminated body was observed under an optical microscope to examine the presence or absence of gaps (voids) in the vicinity of wiring.

The embeddability was evaluated as "good" when there were no voids between the wiring and the resin film as illustrated in the upper diagram of FIG. 1 and as "poor" when there were voids as illustrated in the lower diagram of FIG. 1.

The results are summarized in Table 3 below. The numbers of "resin film used" in Table 3 correspond to the numbers of the resin films presented in Table 2.

TABLE 3

|  | Example 1 | Example 2 | Example 3 | Example 4 | Example 5 | Example 6 | Example 7 | Example 8 | Example 9 |
|---|---|---|---|---|---|---|---|---|---|
| Resin film used | 1 | 2 | 3 | 4 | 5 | 6 | 7 | 8 | 9 |
| Elongation at break [%] | 123 | 98 | 177 | 75 | 156 | 397 | 104 | 442 | 145 |
| Stress at break [MPa] | 18.1 | 21.5 | 13.4 | 24.0 | 12.3 | 4.4 | 17.8 | 7.2 | 20.4 |
| Deformation [%] | 0.2 | 0.4 | 0.2 | 0.3 | 0.4 | 0.4 | 0.3 | 0.5 | 0.2 |
| Copper foil peeling stress [kN/m] | 1.9 | 1.7 | 1.9 | 1.8 | 1.9 | 1.0 | 2.2 | 2.1 | 1.9 |
| Resin flowability (embeddability) | good | good | good | good | good | good | good | good | good |
| Storage modulus at 200° C. [MPa] | 1.8 | 2.1 | 1.7 | 3.1 | 0.2 | 1.8 | 1.7 | 1.9 | 1.6 |
| Glass transition temperature [° C.] | 62.5 | 59.8 | 65.2 | 67.4 | 30.9 | 5.6 | 67.5 | −0.2 | 73.4 |
| Tensile modulus [MPa] | 43.5 | 45.2 | 40.0 | 49.2 | 3.4 | 0.5 | 50.5 | 0.2 | 56.2 |

|  | Example 10 | Example 11 | Example 12 | Example 13 | Comparative Example 1 | Comparative Example 2 | Comparative Example 3 | Comparative Example 4 | Comparative Example 5 |
|---|---|---|---|---|---|---|---|---|---|
| Resin film used | 10 | 11 | 12 | 13 | 14 | 15 | 16 | 17 | 18 |
| Elongation at break [%] | 238 | 84 | 139 | 72 | 47 | 204 | 173 | 140 | 319 |
| Stress at break [MPa] | 11.4 | 23.1 | 19.9 | 8.8 | 22.4 | 13.0 | 3.9 | 10.1 | 2.5 |
| Deformation [%] | 0.2 | 0.4 | 0.4 | 0.5 | 0.4 | 0.2 | 0.4 | 0.7 | 0.1 |
| Copper foil peeling stress [kN/m] | 2.3 | 2.2 | 2.0 | 1.9 | 1.7 | 1.8 | 0.9 | 1.8 | 1.8 |
| Resin flowability (embeddability) | good | good | good | good | good | poor | good | good | good |
| Storage modulus at 200° C. [MPa] | 1.8 | 1.9 | 1.8 | 2.2 | 2.1 | 1.6 | 1.6 | 1.9 | Unmeasurable |

TABLE 3-continued

| | | | | | | | | | |
|---|---|---|---|---|---|---|---|---|---|
| Glass transition temperature [° C.] | 49.3 | 69.0 | 63.8 | 61.6 | 60.4 | 66.6 | 3.3 | 38.1 | 12.0 |
| Tensile modulus [MPa] | 25.0 | 51.9 | 48.8 | 55.8 | 48.1 | 36.4 | 5.8 | 7.7 | 3.2 |

<Discussion>

From the above results, it has been indicated that the resin films (resin films 1 to 13) using the resin compositions according to the present invention are equipped with heat resistance, do not break even when elongated greatly, and have excellent stress at break. It has also been confirmed that deformation hardly occurs even when the resin films according to the present invention are cured to be formed into cured films. Furthermore, it has also been found that the resin films exhibit excellent adhesiveness (adhesiveness to metal foil) and resin flowability. It has also been confirmed that the elastic modulus at room temperature is low and the flexibility is high when the Tg is 60° C. or less. By comparison between Example 2 and Example 13, it has also been found that there is a tendency that the breaking strength is further improved as the polydispersity Mw/Mn is smaller but the resin film is harder and more brittle (the breaking strength decreases) as the polydispersity Mw/Mn is larger.

On the other hand, in the resin film of Comparative Example 1 (resin film 14) in which the molecular weight of the acrylic resin used is too small, it has been found that sufficient elongation at break cannot be obtained and sufficient flexibility cannot be obtained. Meanwhile, in the resin film of Comparative Example 2 (resin film 15) in which the molecular weight of the acrylic resin used is too large, the resin flowability is poor.

In Comparative Example 3 (resin film 16) in which an acrylic resin not having the polymerization unit (B) is used, the stress at break is less than 4 MPa and the strength is not sufficient. In Comparative Example 4 (resin film 17) in which an acrylic resin not having the polymerization unit (C) is used, curing shrinkage of the film occurs and the deformation exceeds 0.6 mm. In Comparative Example 5 (resin film 18) in which an acrylic resin not having the polymerization unit (A) (epoxy equivalent weight of 0) is used, the storage modulus at 200° C. cannot be measured and it has been confirmed that sufficient heat resistance is not obtained.

This application is based on Japanese Patent Application No. 2020-133343 filed on Aug. 5, 2020, the contents of which are incorporated herein.

In order to express the present invention, the present invention has been adequately and sufficiently described above through embodiments with reference to specific examples, drawings and the like, but it should be recognized that those skilled in the art can easily modify and/or improve the above-described embodiments. Therefore, modifications or improvements made by those skilled in the art are construed to be covered by the scope of the claims as long as the modifications or improvements do not deviate from the scope of the claims set forth in the claims.

INDUSTRIAL APPLICABILITY

The present invention has wide industrial applicability in technical fields related to electronic materials and all kinds of devices using the same.

The invention claimed is:

1. A resin composition comprising:
   an acrylic resin and a curing agent,
   wherein the acrylic resin contains a polymerization unit (A) of a (meth)acrylate having an epoxy group, a polymerization unit (B) of acrylonitrile or methacrylonitrile, and a polymerization unit (C) of a (meth)acrylate having an isobornyl group,
   a weight average molecular weight of the acrylic resin is 50,000 or more and 3,000,000 or less, and
   a storage modulus of a cured product of the resin composition at 200° C. is 0.1 MPa or more and 3.5 MPa or less.

2. The resin composition according to claim 1, wherein a tensile modulus of a cured product of the resin composition is 0.1 MPa or more and 0.5 GPa or less.

3. The resin composition according to claim 1, wherein an epoxy equivalent weight of the polymerization unit (A) with respect to a total amount of the acrylic resin is 1000 g/eq or more and 8000 g/eq or less.

4. The resin composition according to claim 1, wherein the curing agent contains at least one selected from an acid anhydride, an amine-based curing agent, a phenol-based curing agent, or a carboxylic acid-based curing agent.

5. The resin composition according to claim 1, wherein the curing agent contains a polyfunctional acid anhydride having a functionality of two or more.

6. The resin composition according to claim 1, wherein an acid anhydride equivalent weight of the curing agent is 100 g/eq or more and 500 g/eq or less.

7. The resin composition according to claim 1, wherein polydispersity (Mw/Mn) of average molecular weight of the acrylic resin satisfies the following Equation (1):

$$1.1 \leq Mw/Mn \leq 3.0 \tag{1}$$

where, Mn is a number average molecular weight and Mw is a weight average molecular weight.

8. The resin composition according to claim 1, comprising the polymerization unit (B) at 1 part by mass or more and 30 parts by mass or less with respect to 100 parts by mass of the acrylic resin.

9. The resin composition according to claim 1, comprising the polymerization unit (C) at 1 part by mass or more and 50 parts by mass or less with respect to 100 parts by mass of the acrylic resin.

10. The resin composition according to claim 1, wherein a glass transition temperature of a cured product of the resin composition is 60° C. or less.

11. A resin film formed using the resin composition according to claim 1.

12. A metal foil with resin comprising the resin film according to claim 11 and a metal foil overlapping with the resin film.

13. A resin sheet material comprising the resin film according to claim 11 and a support overlapping with the resin film.

14. A metal-clad laminate comprising an insulating layer containing a cured product of the resin composition according to claim 1, and a metal foil overlapping with the insulating layer.

15. A wiring board comprising an insulating layer containing a cured product of the resin composition according to claim 1, and a wiring provided on at least one selected from a surface or inside of the insulating layer.

* * * * *